United States Patent [19]

Peterson

[11] Patent Number: 5,583,601
[45] Date of Patent: Dec. 10, 1996

[54] PHOTOGRAPHIC FILM SANDWICHES

[76] Inventor: Laurence D. Peterson, 14-16 Passage Thiere, 75011, Paris, France

[21] Appl. No.: 213,437

[22] Filed: Mar. 14, 1994

[51] Int. Cl.$^6$ .............................. G03B 19/00; G03D 9/00
[52] U.S. Cl. ............................................. 396/661; 396/580
[58] Field of Search ................................. 354/354, 297, 354/306, 301

[56] References Cited

U.S. PATENT DOCUMENTS

| | | |
|---|---|---|
| 640,469 | 1/1900 | Jacobson . |
| 2,083,249 | 6/1937 | Thomson . |
| 2,374,389 | 4/1945 | Snyder . |
| 3,337,341 | 8/1967 | Ryan . |
| 3,739,700 | 6/1973 | Yost, Jr. ................................. 95/12.2 |
| 3,772,106 | 11/1973 | Giorgi ........................................ 156/58 |
| 3,820,874 | 6/1974 | Scarpetti .................................. 95/1 R |
| 3,940,778 | 2/1976 | Craig et al. ............................... 354/282 |

*Primary Examiner*—Michael L. Gellner
*Assistant Examiner*—Daniel Chapik

[57] ABSTRACT

Film or digital color composite images comprised of sandwiching film or capturing digitally and assembling with computergraphics software: 1) a color positive image, and 2) a color negative image possessing substantially the same subject captured in the positive image. The resultant color composite image is made in a very reproducible and highly controlled manner with features reminiscent of color solarization. These color composite images, assembled in both film and digital form, have uses in the creation and production of artwork for cinematography, graphic arts, signs, advertising, book and magazine illustration, computergraphics, color separation, photographic prints as well as photomechanical reproduction such as offset lithography or silkscreen printing.

11 Claims, 1 Drawing Sheet

PHOTOGRAPHIC FILM SANDWICHES

TECHNICAL FIELD

This invention concerns the production of photographic color film sandwiches which are useful in the creation and production of artwork for photomechanical reproduction and cinematography.

BACKGROUND OF THE INVENTION

Although color film has only become widely popular in the last 25 or so years, the basic principles are almost as old as photography itself. All color film is based upon the discovery in the mid-19th century that colored light can be split into three primary colors: blue, green and red. If you project each of these three colors separately onto a screen, you can make white and almost any other color in the spectrum by overlapping them in proportion.

Color print film consists of three separate emulsion layers (one sensitive to blue light, one to green and the other to red) all coated together onto a film base. This film "tripack" is generally constructed as follows: a top layer sensitive to blue and ultraviolet light and containing silver bromide without any color sensitization dyes. The second layer is sensitive to both blue and green light and consists of a silver bromide emulsion with certain color sensitization dyes added.

Since this second layer of the film must only record the green component of the subject, blue light is filtered out by a yellow barrier layer between the first and second emulsion layers. The yellow barrier layer is not made from dyes or pigments, but is colored with finely divided colloidal silver particles which can be removed by processing in a "bleach" bath. The final layer of the film, next to the film base, is sensitive to both blue light and to red light. Since the blue light has already been filtered out by the yellow barrier before it reaches this layer, it records only the red component of the subject.

The three emulsion layers, then, each form an image of one of the three primary colors, blue, green and red. Before processing, however, the film is not actually colored. Color is provided by the formation of appropriately colored dyes in each of the three emulsion layers during processing. The formation of the dyes is controlled by complex organic chemicals known as color couplers. Each of the three emulsion layers contains a different color coupler.

When color print film is processed, the developer reacts with grains of silver in the emulsions to form a silver image just like a black and white negative. Some by-products are produced which react with the color couplers to form the dyes that make the color image. Around each grain of silver in the blue sensitive layer, for example, yellow dye is formed and a yellow image appears. The same type of process occurs in the other layers. Where green light has struck the green sensitive layer, a magenta image is formed, and where red light has struck the red sensitive layer, a cyan (blue-green) image is formed.

After color development, there is both a dye image and a silver image in each emulsion layer. The silver is removed with a chemical agent in subsequent processing which converts silver back into silver bromide without affecting the dye images in each layer. This chemical agent however also selectively "bleaches out" the yellow filter layer. After this processing step, the film is immersed in a "fixing" bath which solubilizes the silver bromide so that it can be "washed out" in the next processing step before the film is hung up to dry. The most common color negative process was developed by Eastman Kodak and is called the "C-41 film processing system".

The resultant "color negative" is negative in two senses. Not only are the light tones in the subject reproduced as dark in the negative, but all colors in the subject are reproduced as their complementaries in this negative. Each of the three primary colors are rendered as their three complementary colors: blue becomes yellow, green becomes magenta, and red becomes cyan. Just as the printing of a black and white negative gives the image its original values, so too does the printing of a color negative. Color printing paper works in a similar way to film and the "print" is simply a negative image of the negative, that is, a positive.

In contrast to color print film, color reversal film (also often referred to as color slide film or color transparency film) is designed to make color positive images (color transparencies) when the film is processed by a processing method referred to as Ektachrome Process E-6 or simply shortened to "E-6". Ektachrome is Eastman Kodak's trademark. However, E-6 processing chemicals are available from a number of other manufacturers as well. Color reversal film is frequently referred to as "E-6" film and also is available from several manufacturers.

In the typical color reversal film, the latent image, recorded in the three emulsion layers of the film, is developed in complete darkness by the first developer. This produces a negative image comprised of metallic silver which is similar to an ordinary black and white negative. The action of this developer, however, is much more sophisticated. Ultimately, it is responsible for the overall density of the image as well as governing the formation and reproduction of its colors. A brief two or three minute wash follows the first development. The wash removes excess developer and so prevents development from continuing. The next stage is a reversal bath in which the emulsion become laden with a potentially active reversal agent. This activity is triggered by the color developer which follows. Fogging centers form on all the silver halides which were left unexposed by the camera exposure, and were therefore left untouched by the first developer.

The residual silver halide, which is now developable, is converted to a dye image by the color developer. Color couplers contained within the three emulsion layers react with the color developer to produce the yellow component in one layer, the magenta component in another layer, and the cyan component in the third layer. Dye is formed only in those layers where no metallic silver formed during the first development. If one looks at the film at this stage there is no sign of color. All one sees is dense black because the image dyes are still covered by metallic silver. The function of the subsequent processing stages is to remove the silver formed during the first and second development, leaving behind only dyes which combine to form the color positive image.

By making small adjustments to the first development stage it is possible to obtain acceptable transparencies from films which have been exposed at other than the recommended film speed rating. A film knowingly underexposed by one f-stop (ie., exposed as if it were a faster film) can be rescued by increasing the time in the first development stage, e.g., from six to ten minutes (often referred to as "pushing one f-stop"); two f-stops underexposure requires developing an additional minute and a half ("pushing two f-stops"). The limit of correction in the case of overexposure is about one f-stop, achieved by reducing the first development to four minutes (referred to as "pulling one f-stop"). In effect, for film exposed at the manufacturers' recommended film speed rating, "pushing the film one or two stops" in developing tends to make the resulting color positive transparency film appear slightly overexposed. Likewise, by processing the same film by "pulling one stop" would give the resulting color positive transparency film a slightly underexposed appearance.

Normal processing of color print film (the type of film most frequently used by both amateurs and professionals to make color photographic prints) is generally referred to as "C-41 processing". When color print film is processed by the C-41 film processing method, the resulting product is referred to as "color negative film". This color negative film can then by used directly in typical color printing procedures to produce a color photographic print (positive image) which shows the colors as one would have observed them in the original subject matter. If one processes color reversal film by using a C-41 film processing method, then the resulting image is a also color negative image instead of the color positive image which results from the normally recommended E-6 processing.

Further background material relating to color photographic film, development and processing thereof is hereby incorporated by reference:

Reference 1) "Understanding Color Negative Film", The Photo, Vol. 2, pp. 546–547, Marshall Cavendish Corporation, New York (1986).

Reference 2) "Understanding Color Slide Flmn", The Photo, Vol. 3, pp. 574–575, Marshall Cavendish Corporation, New York (1986).

Reference 3) "Processing Color Slides", The Photo, Vol. 4, pp. 894–895, Marshall Cavendish Corporation, New York (1986).

Reference 4) "Colour Photography", Encyclopedia Britannica, Vol. 25, pp. 790–792 (1991).

Of all the techniques for creating special effects in the darkroom, few can transform an image more dramatically than those based upon a phenomenon discovered in 1862 by a Frenchman, Armand Sabattier. Sabattier noticed that if a wet collodion plate negative was exposed to light during development, the image was partially reversed and became a positive. Modern photographic film and photographic paper can be reversed similarly, by exposure to light during development. This phenomenon, now known as the "Sabattier effect", is often confused with a similar reversal effect known as "solarization", and indeed, the technique for using the Sabattier effect is sometimes known as "pseudo-solarization ". The Sabattier effect and solarization, in effect, produce both a negative and positive image on the same film or paper.

A number of theories have been put forward to explain the Sabattier effect. The most accepted explanation is that the first image that appears on the paper or film forms a mask or stencil. The metallic silver in the shadow areas absorbs much of the light from the second exposure and when white light is turned on, these areas are actually less heavily exposed. The result is that the highlights darken more quickly than the shadows.

An overall fogging exposure by light in the middle of development produces the solarization effect which is characterized by darkening the previously undeveloped areas and reversing some of the color tones. Although solarization and the Sabattier effect look similar, solarization takes place for quite different reasons. Unlike the Sabattier effect, which can only take place during development, solarization is due to excessive exposure at any time. True solarization is very difficult to achieve so photographers generally employ the Sabattier effect since they can get much the same result. The process which involves exposing a print to light during development is relatively uncertain so photographers must do a lot of experimentation on any one photographic print and they find the process very difficult to repeat.

Because of the difficulty in reproducing the Sabattier effect or solarization, it is generally done in black and white since it is less complex than color. However, the Sabattier effect or solarization is even more startling in color. As expected, the results are even less predictable in color than in black and white and the failure rate is very high since there are three emulsion layers in color film, not just one as in black and white. It is possible to solarize color reversal film, unfortunately, the process does not work very well with reversal film material and the cost is generally considered too prohibitive for the amount of experimenting that is needed to find the best combination of development times and fogging exposures (see reference 6 below).

Further background material relating to the Sabattier effect (pseudosolarization) and color solarization is hereby incorporated by reference:

Reference 5) "Understanding Solarization and Sabattier Effects", The Photo, Vol. 3, pp. 754–755, Marshall Cavendish Corporation, New York (1986).

Reference 6) "Simple Sabattier Effects", The Photo, Vol. 5, pp. 1358–1361, Marshall Cavendish Corporation, New York (1986).

Reference 7) "Solarization and the Sabattier Effect", Photography in Focus, M. Jacobs and K. Kokrada, pp. 202–205, National Textbook Company, Lincolnwood, Ill. (1985).

My invention produces an effect which has characteristics similar to that produced by color solarization or the Sabattier Effect. However, with my invention color positive film images can be produced with a high degree of reproducibility, made with a broad range of color possibilities and a great degree of color density control. Moreover, my invention permits an artist/photographer to create a measurable and calculatable (by f-stops) degree of contrast in the resultant composite image. The broad range of color flexibility and greater degree of control greatly reduces the time and cost in producing a color positive film image with a "solarization effect" suitable for commercial use in cinematography, signs or for the production of photographic prints or conventional photomechanical reproduction processes for advertising brochures and magazine or book illustrations.

Photographers frequently sandwich (layer or laminate) two photographic film images to produce a photographic montage, which is a combination of two or more different images taken at different times. They may sandwich two different color positive transparency images taken of different subjects exposed on color reversal film which is subsequently processed using the recommended E-6 film processing method. Also, they may sandwich two different color negatives taken of different subjects at different times to achieve a photographic montage effect. In some instances, photographers have sandwiched color positive transparencies with black and white negatives of the same image or black and white positive images with color negatives of the same or substantially the same image (See Reference 8, p 112).

Reference 8) The Book of Special Effects Photography, Michael Langford, Alfred A. Knopf, New York, N.Y. (1981).

Photographers are unable, in practice, to sandwich (layer or laminate) color positive image transparency film in a registered or even near-registered manner with a color negative image transparency film taken of the same subject, or substantially the same subject, since color theory would predict that the combined image would appear substantially black or opaque in as much as the complementary colors in the respective positive and negative images would effectively filter out or absorb most, if not all, of the transmittable white light. Further background information relating to sandwich structures is hereby incorporated by reference:

Reference 9) "Sandwiching", Outstanding Special Effects Photography on a Limited Budget, Jim Zuckerman, Chapter 5, pp. 63–75, Writer's Digest Books, Cincinnati, Ohio (1993).

Therefore, it is unexpected and novel to sandwich (layer or laminate) color positive image transparency film with color negative image transparency film capturing the same, or substantially the same, subject matter as in the present invention for the purpose of producing a color photographic transparency film laminate for use in projecting the resulting image, for cinematographic purposes, for subsequent production of a photographic print therefrom, for photomechanical reproduction using offset printing or silkscreen printing.

SUMMARY OF THE INVENTION

The subject invention involves formation of a sandwich or laminated structure comprised of: 1) a layer of color positive image film (Image A) produced by capturing a subject by exposing (with a camera) color reversal film and developing said film by an E-6 film processing system to produce a color positive image, and 2) a second layer of a color negative image film (Image B) produced by capturing the same, or substantially the same, subject by exposing (with a camera) color reversal film but instead developing said film by a C-41 film processing system to produce a color negative image, and wherein the image in each layer (Image A and Image B) display substantial contrast and are subsequently registered (or slightly off-registered) with each other in the resulting sandwich structure.

These superimposed multi-image sandwich or laminated structures result in startling images having extremely vivid colors as well as a three dimensional appearance. These sandwiches also possess features similar to those previously achieved only by solarization or pseudo-solarization (Sabattier) techniques. However, and very importantly, compared with any other means of producing such images, these multi-image sandwich structures of this invention can be made in a very reproducible manner and with a high degree of color control in contrast to the prior art involving solarization or pseudo-solarization (Sabattier) techniques. The superimposed multi-image sandwiches or laminates are useful in projecting images, cinematography (motion picture films), signs, to produce photographic prints, color separations, or in printing with conventional multi-color printing processes such as offset lithography for advertising, magazine or book illustrations, or graphic design.

Important embodiments of the invention involve pushing (overdeveloping) the development of the color reversal film employed in the production of the color positive image (Image A) by one-half or more f-stops during development in an E-6 film processing system and/or pulling the development (underdeveloping) of the color reversal film employed in the production of the color negative image (Image B) by one-half or more f-stops during development in a C-41 film processing system as a means of increasing the contrast between the positive and negative image films.

Additional embodiments of the invention involve under or overexposure of the color reversal film used to capture the subject prior to developing the film by an E-6 film processing system in producing the color positive image (Image A) as well as under or over exposure of the same subject captured on the color reversal film which is used to produce the color negative image (Image B) by developing said film by a C-41 film processing system, again as another means of increasing the contrast between the positive and negative images.

Also, in another embodiment of the invention, color negative film (color print film) which is subsequently developed by the recommended Co41 film processing system can be used in the production of the color negative image (Image B). My invention can use a wide variety of color reversal film (ie., is not dependent upon film manufacturer or ISO rating) and can use a wide variety of color reversal film or color print processed by a C-41 film processing method to produce the color negative image.

Additionally, the color positive image film and color negative image film which comprise my invention can be digitized employing available digital optical film scanning devices and the resulting "digitized images" can then be assembled using computergraphics software to produce a "digital composite image" which can then be employed by using the appropriate computergraphics file formats directly in cinematography, to produce composite film which embodies the image contained in the multi-image sandwich film structure of this invention as well as be used in photomechanical reproduction systems, such as offset lithography for advertising brochures and magazine or book illustration.

BRIEF DESCRIPTION OF THE FILM SANDWICH INCLUDED HEREIN

Because of the nature of the invention, being of two-dimensional film form, and the possible difficulties in understanding the subject matter or appreciating the actual invention itself, I have chosen to provide a representative example in Attachment 1 (triplicate copies) of the actual color film sandwich structure which is described in Example 1 below along with copies of the individual color positive image film (Image 1A) and color negative image film (Image 1B) which comprise the color film sandwich (Composite Image 1). These film images are best observed and understood by holding the film images in front of a light source such as a fluorescent ceiling light in an office.

DETAILED DESCRIPTION OF THE INVENTION

Figure 1:
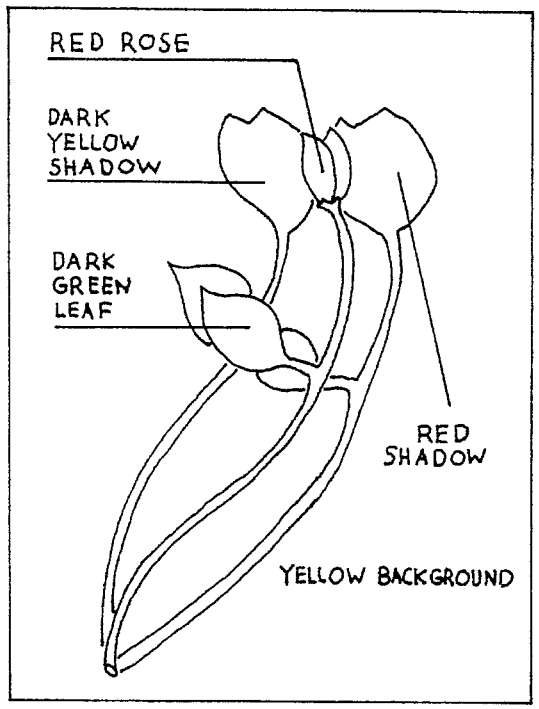
Figure 2:
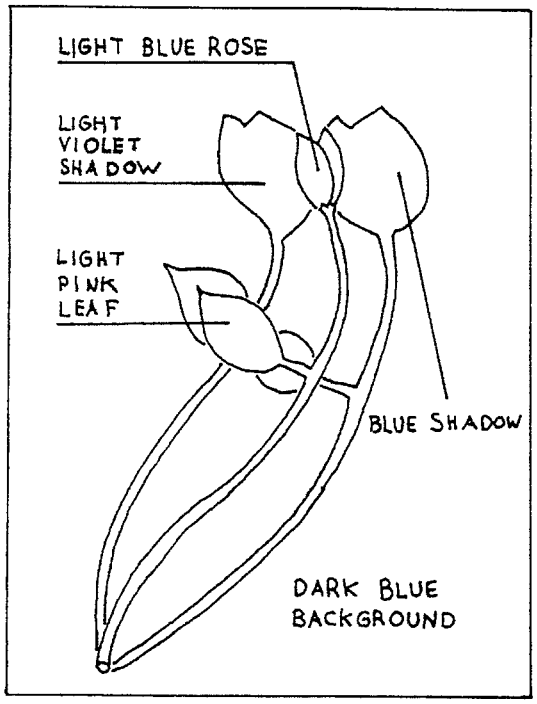
Figure 3:
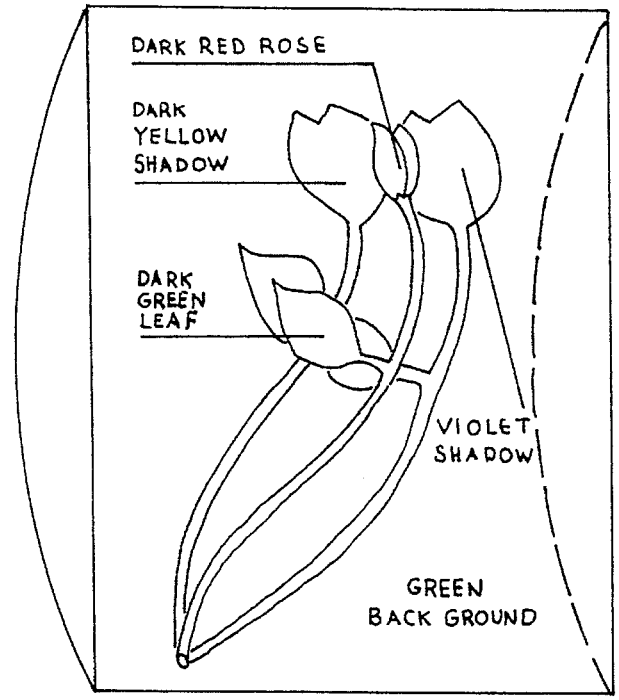

The preferred embodiment of the invention (Example 1) involves formation of a sandwich or laminated structure comprised of two layers of film. One layer (Image 1A) consisted of a color positive image film produced by capturing a subject employing a camera which exposed at the recommended film speed rating, a 120 size color reversal film (Kodak Ektachrome 64T Color Reversal Film EPY, (ISO 64)) and said film was developed as recommended by an E-6 film processing system pushed in the development process by 2 f-stops (to produce a slightly overexposed effect) and then registering this film with a second layer (Image 1B) of color negative image film produced by capturing the same subject employing a camera which exposed at the recommended film speed rating, the same type of 120 size color reversal film (Kodak Ektachrome 64T Color Reversal Film EPY, (ISO 64)) but said film was developed by a C-41 film processing chemical system pulled by one-half an f-stop in the processing (producing a slightly underexposed effect). The resulting registered color transparency film sandwich structure (Composite Image 1) comprised of Image 1A and Image 1B displayed extremely vivid colors and had a high degree of contrast similar to film images produced using solarization techniques. Composite Image 1 is useful in the production of artwork for cinematography (motion picture film), graphic arts, signs, advertising, book and magazine illustration, computer graphics, color separation, photographic prints as well as photomechanical reproduction such as offset lithography or silkscreen printing. Also, Image 1A and Image 1B can be slightly off-registered, if desired, to produce a slightly different effect.

In another embodiment of the invention (Example 2), a sandwich or laminate structure was constructed of two layers of film wherein one layer (Image 2A) consisted of a color positive image film produced by capturing a subject using a camera which exposed at 2 f-stops in excess of the recommended film speed rating (slightly overexposing the film), a 120 size color reversal film (Kodak Ektachrome EPD Color Reversal Film, (ISO 200)) and said film was developed as recommended by an E-6 film processing method in the normal manner. The second layer of this sandwich structure consisted of a color negative film (Image 2B) which captured the same subject as in Image 2A of the first layer using a camera to expose at one f-stop less than the recommended film speed rating (slightly underexposing the film), a 120 size color reversal film (Fujichrome Velvia RVP (ISO 50)) and said film was developed by a C-41 film processing system in the normal manner. Again, the two images (Image 2A and Image 2B) were registered (matched) with each other and the resultant superimposed, multi-image sandwich structure exhibited very striking features reminiscent of those produced using the Sabattier effect. This composite image is useful as the artwork for cinematography (motion picture film), graphic arts, signs, advertising, book and magazine illustrations, computer graphics, photographic prints as well as for photomechanical reproduction.

A third embodiment of my invention (Example 3) involved formation of a sandwich structure comprised of two layers of film. One layer of film (Image 3A) consisted of a color positive image film produced by capturing a subject employing a camera which exposed at the recommended film speed rating, a 120 size color reversal film (Fujichrome Velvia RVP (ISO 50)) and said film was developed as recommended by an E-6 film processing method pushed in the development one f-stop (slightly overdeveloped) and then this film was registered with another layer of film (Image 3B) of color negative film produced by capturing the same subject employing a camera which overexposed the subject by one f-stop beyond the recommended film speed rating, a 120 size color reversal film (Fujichrome Velvia RVP (ISO 50)) and said film was developed by a C-41 film processing method. The superimposed film sandwich displayed striking features reminiscent of color solarization and is useful as artwork for the applications mentioned in Examples 1 and 2.

A fourth embodiment of my invention (Example 4) involved formation of a sandwich structure constructed of two layers of film. One layer (Image 4A) comprised a color positive image film produced by capturing a subject, wherein a green filter was used on the lighting on the left side of the subject and a red filter was used on the lighting on the right side of the subject, employing a camera which exposed at the recommended film speed rating, a 120 size color reversal film (Kodak Etkachrome 64T Color Reversal Film EPY, (ISO 64)) and said film was developed as recommended by an E-6 film processing system. The other layer (Image 4B) was comprised of a color negative film wherein the subject was captured by exposing the same type of film at the recommended film speed rating except the lighting was reversed, ie., a red filter was used on the lighting on the left side of the subject and a green filter was used on the lighting on the right side of the subject) and the film was developed instead by a C-41 film processing system. The resultant multi-image film sandwich comprised of Image 4A and Image 4B portrayed the subject with a very intense green color on its left side and a very intense red color on its right side. This striking composite film sandwich, is useful in the production of art work for cinematography and photomechanical reproduction for magazine and book illustrations.

In another example of the invention (Example 5), a multi-image sandwich structure is constructed from a color positive image film produced by capturing a predominately red colored subject using a camera to expose at 2 f-stops in excess of the recommended film rating (slightly over exposing the film), a 120 size color reversal film (Kodak Ektachrome EPP Professional Color Slide Film, (ISO 100)) and said film was developed as recommended by an E-6 film processing method in the normal manner. The second layer of the sandwich structure was comprised of a color negative film wherein the subject was captured by exposing the same type of film at the recommended film speed rating except a green filter was used on the lighting for the subject and the film was developed instead by a C-41 film processing method wherein the red objects in the subject were transparent in the resultant negative film. The resultant film sandwich comprised of positive Image 5A and negative Image 5B portrays the red objects in the Composite Image 5 with a greatly accentuated red color. Similarly, other colors can be accentuated by capturing the negative image using lighting of the complementary color from that of the objects which are chosen to be accentuated (ie. blue objects may be accentuated by using an orange filter on the lighting for the negative image).

Also, in Example 6, monochrome negative image film was employed for the film in the above example to capture the subject for the negative image used in the sandwich and said film was developed by the film processing method recommended to produce a negative image. Again, as in Example 5, the red objects in the subject were transparent on the resultant negative and all other colors were shades of grey. The resultant sandwich (Composite Image 6) produced an image wherein the red objects in the subject were greatly accentuated. In both Examples 5 and 6, the resultant sandwiches are useful in the production of artwork for cinematography and photomechanical reproduction for magazine or book illustrations.

In a seventh embodiment of the invention (Example 7), a multi-image laminate structure was constructed from a color positive image film produced by capturing a subject using a camera to expose at 2 f-stops in excess of the recommended film rating (slightly over exposing the film), a 120 size color reversal film (Fujichrome Velvia RVP (ISO 50)) and said film was developed as recommended by an E-6 film processing method and a color negative image film produced by capturing essentially the same subject employing a camera to underexpose by one f-stop, a 120 size color print film (Kodacolor Print Film GA100 (ISO 100) and said film was developed as recommended by a C-41 film processing method. The two film images (positive Image 7A and negative Image 7B), when registered and sandwiched produced a very startling effect similar to that observed in films produced by using the Sabattier effect and the resultant laminate is useful in applications cited above.

The purpose of pushing (overdeveloping) the development during processing the film used to produce the color positive image film (Image 1A) and/or pulling (underdeveloping) the development during processing the film in producing the color negative image film (Image 1B) as in the preferred embodiment described above (Example 1 ) is to increase the contrast between the color positive image and the color negative image. The resultant film sandwich possesses an aesthetically more striking image than otherwise obtained. The increase in, or enhancement of, contrast can be achieved by exposing the film at the film speed rating as recommended by the manufacturer in capturing the subject for both Image A and Image B, followed by pushing (overdeveloping) the development of the resultant positive color image by one half or more f-stops and/or pulling (underdeveloping) the development of the color negative image by one-half or more f-stops. Both of these techniques can be performed in a very reproducible and controllable manner using conventional photographic techniques.

Moreover, I have found that my invention allows me to create many artistic options by exposing an entire roll of 120 size film (9–10 exposures) to differing degrees in capturing the subject for the color positive image (Image A) using photographic equipment to vary the exposure with increasing increments of one-half (or even one-quarter) of an f-stop beginning by underexposing the first image captured by 2.0 f-stops, underexposing the second image by 1.5 f-stops, etc., until the ninth image on the roll is overexposed by 2.0 f-stops (wherein the fifth exposure on the roll has the correct exposure according to the recommended film speed rating) and then developing said film as recommended with an E-6 film processing method. Likewise, in capturing the same subject to produce the nine options for the color negative image (Image B) , a second entire roll of film can be exposed in the same sequential manner, but developed by a C-41 film processing method. This procedure produces nine separate color positive images, each with a slightly different exposure (by one-half an f-stop) and nine separate color negative images, each with a slightly different exposure (by one half an f-stop). When laminating the various positive and negative images, eighty one (9×9) different options are available from which to select the sandwich film structure which best conveys the desired aesthetic effect or best achieves the commercial objective.

Using the foregoing procedure (Example 8), nine different color positive images were produced by capturing the same subject using photographic equipment to produce nine different exposure levels (from 2 f-stops less than optimum exposure to 2 f-stops beyond optimum exposure) on a roll (10 exposures) of 120 size color reversal film (Kodak Ektachrome 64T Color Reversal Film EPY (ISO 64)) wherein said roll of film was developed as recommended by an E-6 film processing method pushed by 2 f-stops in the processing to produce nine color positive images (Film Strip 8A). Similarly, nine different color negative images were produced by capturing the identical subject using photographic equipment to produce nine more different exposure levels (again, from 2 f-stops less than optimum exposure to 2 f-stops beyond optimum exposure) on a roll (10 exposures) of 120 size color reversal film (Kodak Ektachrome 64T Color Reversal Film EPY (ISO 64)) and said film was developed using a C-41 film processing method pulled by one-half an f-stop in processing to produce nine color negative images (Film Strip 8B). The resulting nine color positive images can be matched with any of the other nine color negative images to produce eighty one possible different multi-image film sandwich structures depending upon the combinations selected. This example is an excellent demonstration of the high level of control achieved by my invention and great flexibility in optimizing the aesthetic impact of the multi-image film sandwich structure ultimately selected for commercial use.

Another embodiment of this invention (Example 9) entailed constructing a sandwich structure of two layers of film wherein one layer (Image 9A) was comprised of a color positive image film produced by capturing a subject using a camera which exposed at the recommended film speed rating, a 120 size color reversal film (Kodak Ektachrome EPP Professional Color Slide Film (ISO 100)) and said film was developed by an E-6 film processing system pushed in the development process by 2 f-stops and the second layer (Image 9B) was comprised of a color negative image film produced by duplicating the color positive image film (Image 7A) using a color negative film (Ektachrome VPS Professional Color Negative Film (ISO 160)) and said film was developed by a C-41 film processing method pulled in the development process by one f-stop. The resulting sandwich film structure (Composite Image 9) displayed striking color contrast reminiscent of color solarization and is useful as artwork for photomechanical reproduction for magazine or book illustrations.

A tenth embodiment of my invention (Example 10) involved digitizing both the color positive image film and the color negative image film described in Example 1 above by scanning the films (Image 1A and Image 1B) separately with a film scanner (Leafscan 45) to provide input for a variety of computergraphics software (e.g., Adobe Photoshop) which can subsequently assemble the two images to form a digital color composite image file. This digital composite image file then can be utilized directly, or converted to the appropriate computer file format, as digital artwork for cinematography, color separation, photographic prints, as well as in photomechanical reproduction as offset lithography for the production of advertising brochures, book illustrations and magazine illustrations.

An eleventh embodiment of my invention (Example 11) involved capturing a subject employing a digital camera (Kodak DCS 200 Digital Camera). The digitized image is saved as both a positive image file and a negative image file. Both the positive image computer file and the negative image computer file are imported into computergraphics software (Adobe Photoshop) wherein the contrast between the two digital images can be increased by software manipulation and then the two digital images are subsequently registered and assembled into one digital composite image file (Composite Image 11 ). This digital composite image file can be utilized directly (or converted to other more appropriate computer file formats) as digital artwork for cinematography, color separation, photographic prints as well as in photomechanical reproduction such as offset lithography. Alternatively, the digital positive image file from the digital camera can be imported by computergraphics software and therein converted to a digital negative image file. The color tones in the digital positive image can be enhanced (contrasted with that of the digital negative image) by software manipulation. Likewise, the color tones in the digital negative image can be lightened or darkened by software manipulation to produce the same type of contrast differences as produced in film processing by pushing the development in E-6 film processing of the positive image and pulling the development in the C-41 film processing of the negative image.

In the foregoing examples, specific film processing systems were identified in each instance. However, it is well known to the inventor that other film processing chemical systems can be employed to produce the desired positive image film or negative image film in many instances. For example, in the development of color reversal film, such as in the preferred embodiment of the invention described above, Agfa's P-41 film processing method could also be employed with certain color reversal film to produce the color positive image film. Alternatively, processing select color reversal film using Agfa's Process N would result in a color negative image film as would processing certain color print film using this Process N system produce color negative image film. Also the invention is not limited by film size since other film sizes such as 35 mm can be employed. However, to facilitate the registration (matching or superimposing) of the positive image with the negative image, it is more convenient to use a larger format film such as the 120 size or even larger sizes such as 4"×5" film. As demonstrated in the foregoing examples, the invention is not limited to any one film type, manufacturers' brand or ASA (ISO) rating.

Having described my invention in sufficient detail to enable those skilled in the art to make and use it, I claim:

1. A film sandwich comprising:
   (a) a color positive image film produced by capturing a subject by exposing with photographic equipment, a color reversal film and developing said film by an E-6 film processing method, and
   (b) a color negative image film produced by capturing substantially the same subject by exposing with photographic equipment, a color reversal film and developing said film by a C-41 film processing method.

2. A film sandwich produced in accordance with claim 1 wherein:
   a) said color reversal film employed for the positive image is developed by an E-6 film processing method wherein the development is pushed at least one-half an f-stop, and
   b) said color reversal film employed for the negative image is developed by a C-41 film processing method wherein the development is pulled at least one-half an f-stop.

3. A film sandwich produced in accordance with claim 1 wherein said film used to capture said subjects for said film images is exposed by photographic equipment at exposure levels other than that of the recommended film speed rating.

4. A film sandwich produced in accordance with claim 1 wherein said color negative image film is produced using color negative film instead of said color reversal film.

5. A film sandwich produced in accordance with claim 1 wherein the color negative image film was produced by duplicating said color positive image film using photographic equipment to expose film which will produce a color negative image upon development.

6. A film sandwich produced in accordance with claim 1 wherein the lighting for said subject for the negative image is substantially different from the lighting for said subject for the positive image.

7. A film sandwich produced in accordance with claim 1 wherein:
   a) the lighting for said subject for the negative image is substantially different from the lighting for the positive image, and
   b) monochrome negative image film is employed for the negative image and is developed by a process which produces a monochrome negative image.

8. A film sandwich produced in accordance with claim 1 wherein the positive image is off-registered with the negative image.

9. A film sandwich produced in accordance with claim 1 comprising:
   a) a color positive film image selected from a film strip wherein multiple image options are created by capturing said subject by exposing said film sequentially at differing exposure levels with photographic equipment, and
   b) a color negative film image selected from a film strip wherein multiple image options are created by capturing said subject by exposing said film sequentially at differing exposure levels with photographic equipment.

10. A process for producing a film image by using a registered multi-image transparency film laminate comprising:
    a) a positive image transparency film produced by capturing a subject by exposing with photographic equipment, monochrome positive image transparency film and developing said film in accordance with manufacturer's recommended film processing method,
    b) a color negative transparency film produced by capturing substantially the same subject by exposing with photographic equipment, color reversal film of the tricolor substantive-coupler type and developing said film in accordance with the chemical processing methods typically recommended by manufacturers of color print film of the tricolor substantive-coupler type.

11. A process for producing a film image by using a registered multi-image transparency film laminate comprising:
    a) a color positive image transparency film produced by capturing a subject by exposing with photographic equipment, color print film of the tricolor substantive-coupler type wherein the development is pushed at least one-half an f-stop, and
    b) a color negative image transparency film produced by capturing substantially the same subject by exposing with photographic equipment, color print film and developing said film in accordance with manufacturer's recommended film processing method wherein the development is pulled at least one-half an f-stop.

* * * * *